United States Patent [19]

Wong et al.

[11] Patent Number: 5,432,463

[45] Date of Patent: Jul. 11, 1995

[54] HIGH SPEED NOR GATE WITH SMALL OUTPUT VOLTAGE SWINGS

[75] Inventors: Jack T. Wong, Fremont; Fabiano Fontana, Santa Clara; Henry Law, Cupertino, all of Calif.

[73] Assignee: Advanced Micro Devices, Inc., Sunnyvale, Calif.

[21] Appl. No.: 138,303

[22] Filed: Oct. 15, 1993

[51] Int. Cl.⁶ .......................................... H03K 17/30
[52] U.S. Cl. ...................................... 326/32; 326/33; 326/34; 326/108
[58] Field of Search ............... 307/493, 451, 452, 264, 307/296.8, 310; 326/31–34, 86, 108, 121

[56] References Cited

U.S. PATENT DOCUMENTS

| | | | |
|---|---|---|---|
| 4,408,474 | 9/1983 | Dingwall | 307/451 X |
| 4,491,747 | 1/1985 | Shimizu | 307/443 X |
| 4,645,952 | 2/1987 | van Tran | 307/451 X |
| 4,728,827 | 3/1988 | Woo | 307/443 X |
| 4,763,021 | 8/1988 | Stickel | 307/310 X |
| 5,264,741 | 11/1993 | Srinivasan et al. | 307/451 X |
| 5,329,185 | 2/1994 | Cooperman et al. | 303/451 X |

*Primary Examiner*—David R. Hudspeth
*Attorney, Agent, or Firm*—Raymond Kam-On Kwong; Joseph A. Sawyer, Jr.; Judy M. Maher

[57] ABSTRACT

A high speed multiple input NOR gate. In an illustrative embodiment, the invention includes a plurality of pull-down transistors for providing an output signal. A pull-up transistor is coupled to the plurality of pull-down transistors for providing a drive current. A regulator is coupled to the pull-up transistor for regulating the drive current in response to temperature and power supply voltage variation so as to maintain the speed of the output signal during a low-to-high transition of the output signal. In specific implementations, the NOR gate is designed to regulate the output signal so that a high level or a low level thereof is maintained at a predetermined level. The several embodiments disclosed provide: 1) a high speed NOR gate that offers high speed performance on both the low-to-high and high-to-low transitions; 2) a high speed NOR gate for which voltage swings on the input circuits thereof are minimal; 3) a high speed NOR gate with pull-up current temperature and voltage compensation for improved performance on the low-to-high transition of the output; and 4) a high speed NOR gate using a feedback technique to regulate and limit the logic low voltage on the output such that this level has minimal variation independent of the number of the NOR inputs held in the logic high state.

20 Claims, 5 Drawing Sheets

HIGH SPEED NOR GATE WITH SMALL OUTPUT VOLTAGE SWINGS

FIELD OF THE INVENTION

The present invention relates to logic circuits. More specifically, the present invention relates to multiple input NOR gates.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

BACKGROUND OF THE INVENTION

A NOR gate is a semiconductor integrated logic circuit that has a high output when all the inputs are logic low and a low output when at least one or more inputs are logic high. The number of inputs may range from two to twenty in a typical integrated circuit. Each input is typically a gate terminal for one of a plurality of pull-down n-channel CMOS (complementary metal-oxide semiconductor) transistors arranged in parallel and sourced by a single pullup transistor.

Inasmuch as NOR gates are frequently used in the critical delay path where speed is a primary concern, a great deal of effort has been expended over the years to reduce the propagation delay of NOR gates, viz., the time delay between the appearance of an input signal at the output.

Unfortunately, several problems plague the conventional multiple input NOR gate. First, the low level of the output signal varies depending on the number of input transistors that are turned on. The more the number of transistors are turned on, the lower the output voltage. Since the logic high output voltage is almost always at the source level ($V_{cc}$), the voltage swing on the output could be from zero to $V_{cc}$ or rail-to-rail.

There are shortcomings associated with this design. First, due to capacitive effects, the rail-to-rail voltage swing results in poor propagation delay. Second, the low-to-high transition on the output is poor at high operating temperatures because the current conduction of the pull-up transistor degrades with temperature due to a decrease in carrier mobility. Consequently, the current charging the output node decreases with temperature, resulting in slower propagation delay on the low-to-high transition.

These prior NOR gate designs do not provide adequate speed for some current high-speed integrated circuit applications.

Thus, there is a long felt and unsatisfied need for an improved multiple input NOR gate design. Specifically, the multiple input NOR gate design should be one that offers high speed performance due to a small output voltage swings and good low-to-high transition at the output without speed degradation at high temperatures.

SUMMARY OF THE INVENTION

The need in the art is addressed by the high speed multiple input NOR gate of the present invention. In an illustrative embodiment, the invention includes a plurality of pull-down transistors for providing an output signal. A pull-up transistor is coupled to the plurality of pull-down transistors for providing a drive current. A regulator is coupled to the pull-up transistor for regulating the drive current in response to temperature variation so as to maintain the speed of the output signal during a low-to-high transition of the output signal.

In specific implementations, the NOR gate is designed to regulate the output signal so that a high level or a low level thereof is maintained at a predetermined level.

The several embodiments disclosed provide: 1) a high speed NOR gate that offers high speed performance on both the low-to-high and high-to-low transitions; 2) a high speed NOR gate for which voltage swings on the input circuits thereof are minimal; 3) a high speed NOR gate with pull-up current temperature and voltage compensation for improved performance on the low-to-high transition of the output; and 4) a high speed NOR gate using a feedback technique to regulate and limit the logic low voltage on the output such that this level has minimal variation independent of the number of the NOR inputs held in the logic high state.

DESCRIPTION OF THE INVENTION

Illustrative embodiments and exemplary applications will now be described with reference to the accompanying drawings to disclose the advantageous teachings of the present invention.

Figure 1:
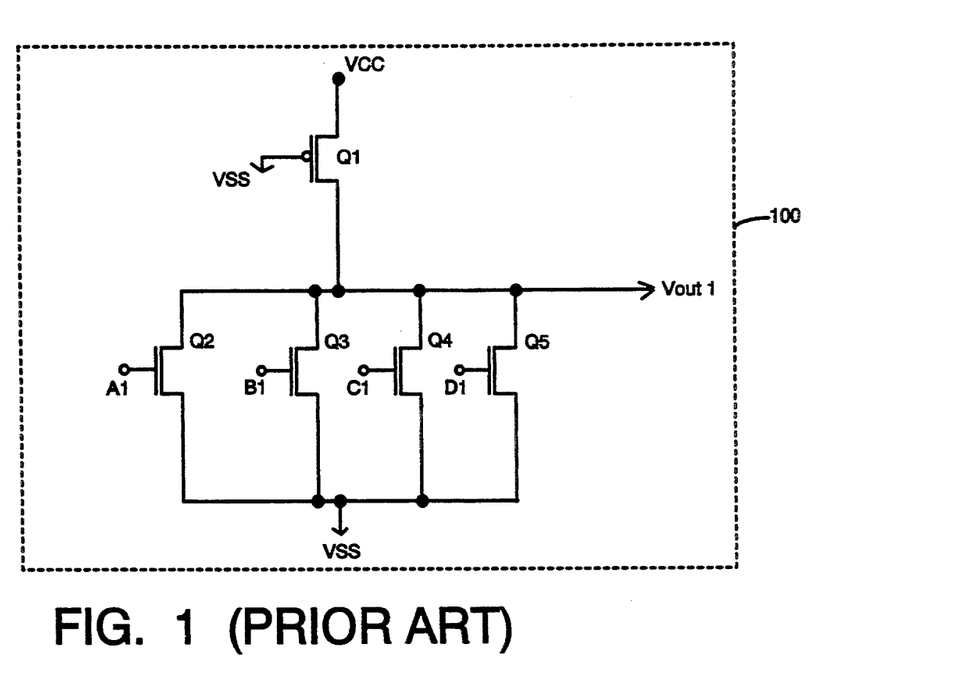
FIG. 1 depicts a typical conventional four input NOR gate.

A typical prior-art four input NOR gate 100 is shown in FIG. 1. Even though there are only four inputs shown in this circuit configuration, this number can be increased without affecting the operation of the circuit as is known in the art. The circuit 100 includes a p-channel MOS transistor Q1 which has its source connected to a source of supply voltage ($V_{cc}$), its gate connected to $V_{cc}$ or ground and its drain connected to an input circuit at an output node. The input circuit includes a plurality of n-channel MOS pull-down transistors Q2, Q3, Q4 and Q5 connected in a parallel configuration. The drain of each pull-down transistor is connected to the drain of the pull-up transistor and the source of each pull-down transistor being connected to $V_{ss}$.

When all the inputs are logic low (e.g., 0 volts), all the n-channel pull-down transistors are off. Thus the output voltage Vout1 is pulled high up to $V_{cc}$ by the p-channel transistor Q1.

When any one of the inputs is logic high while the rest are logic low, then only the transistor associated with the logic high input is on and conducts the current from the pull-up transistor Q1. The output voltage is now in the logic low state with the voltage level determined by the conduction current of transistor Q1 and the size of the turned-on input transistor. In practice, the logic low voltage level is usually below the threshold of the interfacing gate which typically has a 2.5-volt threshold for a device operating in a 5-volt power supply. In the case where only one input transistor is turned on, a logic low voltage level of 1.5 volts is enough to provide sufficient low noise margin. Hence, any one of the input transistors is strong enough to pull the output node down to 1.5 volts when its input is logic high.

In the case when two or more inputs are logic high, the output is logic low also, but the voltage level is biased further below 1.5 volts as more input transistors are turned on and pulling down the output. In the case when all the inputs are logic high in a multiple input NOR gate, the output logic low voltage level is biased virtually to ground potential (0 volt) because all the turned-on input transistors in effect would create a very strong pull-down source.

As is evident from the description above, the logic low voltage level on the output varies depending on how many inputs are at a logic high state. The more inputs are logic high, the lower is the logic low voltage level on the output. Since the logic high voltage level on the output is always $V_{cc}$, then the voltage swing on the output could be as much as from 0 volts (all inputs are logic high) to $V_{cc}$ (all inputs are logic low).

As discussed above, this NOR gate design has two main shortcomings. First, the voltage swing is rail-to-rail in an all input high case, resulting in poor propagation delay. It is often desirable to limit the voltage swing on the output of the NOR gate so as to improve the speed performance. By so limiting the voltage swing, less charge will be required to be charged up and discharged at the output, thereby permitting a faster speed of operation.

Second, the low-to-high transition on the output is poor with at high temperatures because the current conduction of the pull-up transistor Q1 degrades with temperature due to a decrease in the carrier mobility. Consequently, the time for current to charge up the output node increases with temperature, resulting in slower propagation delay on the low-to-high transition.

Figure 2:
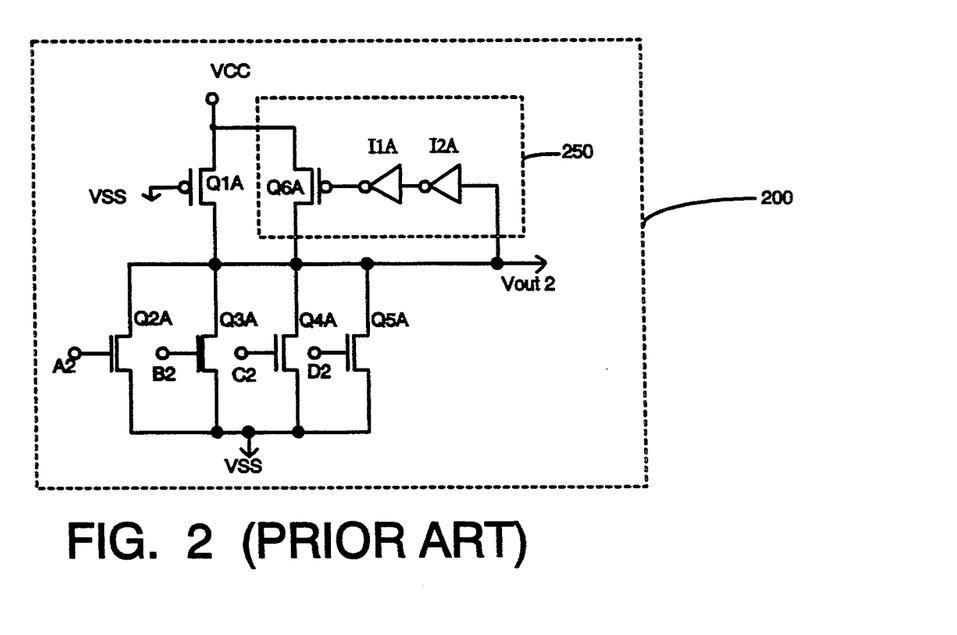
FIG. 2 depicts a second conventional four input NOR gate.

FIG. 2 shows another conventional NOR gate design. This NOR gate 200 has the advantage over the previous prior-art NOR gate in that it has a feedback circuit 250 which helps improve the propagation delay on the high-to-low transition on the output. On the high-to-low transition, the output voltage Vout2 is initially high, which causes the output of the inverter I2A to be logic low and the output of the inverter I1A to be logic high, thus turning off the p-channel transistor Q6A. The only transistor used to hold the output node Vout2 to high level is transistor Q1A, which is designed to be a very weak transistor compared to transistor Q1 in the previous prior-art NOR gate so as to create a very light current loading on the output. A light current loading on the output enables a fast high-to-low transition because a pull-down input transistor now only has to turn on slightly in order to pull the output low.

On the low-to-high transition, the output voltage Vout2 is initially low, which causes the output of the inverter I2A to be logic high and the output of the inverter I1A to be logic low, thus turning on the p-channel transistor Q6A. The two transistors Q1A and Q6A are designed to give the same amount of charging current as that of transistor Q1 in the NOR gate of FIG. 1. As a result, the speed on the low-to-high transition is the same. Hence, the NOR gate of FIG. 2 has better speed performance on the output for the high-to-low transition while maintaining the same speed performance for the low-to-high transition.

Nonetheless, even though the design of FIG. 2 offers an improvement over the that of FIG. 1, it still does not address the poor speed performance due to the rail-to-rail voltage swing on the output and the problem of the pull-up current degradation with temperature.

Figure 3:
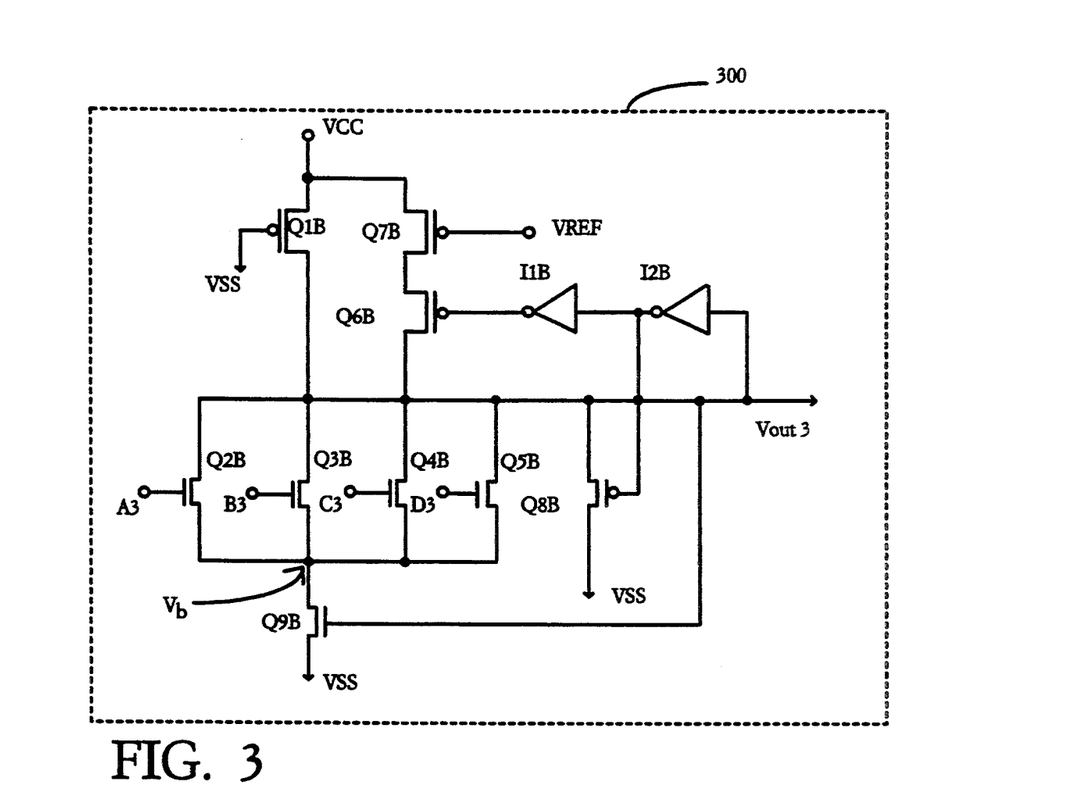
FIG. 3 is an illustrative implementation of the high speed NOR gate of the present invention.

FIG. 3 is a schematic diagram of an illustrative embodiment of the high speed NOR gate 300 of the present invention. Although a four-input NOR gate is shown for illustration, the same teaching may applied to a NOR gate with more than four inputs without departing from the scope of the present invention.

The high speed NOR gate 300 of the present invention is similar to that of FIG. 2 with the exception of the addition of two p-channel transistors Q7B and Q8B, and an n-channel transistor Q9B. The first p-channel transistor Q7B has its source connected to $V_{cc}$ and its drain connected to the source of Q6B. The first p-channel transistor Q7B is controlled by the application of a reference voltage to the gate thereof. The second p-channel transistor Q8B has its source connected in parallel with the input transistors Q2B, Q3B, Q4B, and Q5B and its drain connected to $V_{ss}$. However, the gate of the second p-channel transistor Q8B is connected to the output of the first inverter I2B. The novel n-channel transistor Q9B has its drain connected to the source of the transistors Q2B, Q3B, Q4B and Q5B of the NOR gate and the source of the transistor Q9B is connected to $V_{ss}$. The gate of the n-channel transistor Q9B is connected to the output of the NOR gate thereby providing a feedback path.

In operation, when all the inputs are logic low (e.g., 0 volts), all the n-channel pull-down transistors are off and the output Vout3 is pulled up to a logic high voltage level. When Vout3 is logic high, the output of the inverter I2B is at a logic low and the output of the inverter I1B is at a logic high ($V_{cc}$), turning off the p-channel transistor Q6B and turning on the p-channel transistor Q8B. Since transistor Q6B is not conducting, the logic high voltage level on Vout3 is determined by the bias circuit comprising transistors Q1B and Q8B which are conducting current in this state. Typically, a gate (not shown) which is connected to the NOR gate 300 has a threshold of 2.5 volts in a 5-volt power supply environment. Hence, the sizes of transistors Q1B and Q8B are designed such that the logic high voltage level on Vout3 would be at approximately 3.5 volt for sufficiently high noise margin.

A low level current, in the order of few micro amperes, would be sufficient to operate in the logic high state because this current is used only for holding a DC value of 3.5 volts on the output Vout3. Also, this node voltage is temperature compensated mainly because the pull-up action of transistor Q1B tracks with the pull-down action of transistor Q8B, having both p-channel transistors with similar temperature sensitivity. As can be seen, the above technique limits the logic high voltage level with temperature compensation to 3.5 (for example) volts instead of the typical 5.0 volts in a conventional NOR gate.

When any one of the inputs, for example A3, is logic high while the rest are logic low, then only transistor Q2B is on and conducts. The output voltage Vout3 is now in the logic low state due to the pull-down action of the turn-on transistor Q2B. The output of the inverter I2B is logic high ($V_{cc}$) and the output of the inverter I1B is logic low (0 volt), turning on transistor Q6B which now conducts current and turning off transistor Q8B. The current conducting across transistor Q2B comes from two sources, one from transistor Q1B and the other from transistor Q7B. The transistors are sized such that the pull-up current of transistor Q1B is very weak, on the order of a few micro amperes, as mentioned before. In addition, the system is designed so that the pull-up current of transistor Q7B is much stronger, in the milli-amperes range, because this current is used to quickly charge up the output node Vout3 in the next low-to-high transition. The output logic low voltage level is now predominantly determined by the strong current source of transistor Q7B and the size of transistor Q2B. Typically, the gate (not shown) which interfaces with the output of the NOR gate has a threshold of 2.5 volts in a 5-volt power supply environment. Hence, the size of transistor Q2B is selected to give the logic low voltage level on Vout3 at approximately 1.5 volts for a sufficiently low noise margin.

Using a negative feedback technique, the voltage variation on the logic low voltage level of 1.5 volts is desensitized with respect to the number of logic high inputs, as explain below. When multiple inputs are logic high, the output is the same as above in the logic low state. However, more input transistors (Q2B, Q3B, Q4B, Q5B) are turned on, pulling down the output Vout3. The output Vout3 then tends to drop below 1.5 volts and towards ground (0 volts). However, as it attempts to do so, the voltage on the gate of transistor Q9B tracks with Vout3 and drops also, decreasing the driving capability of Q9B. Since transistor Q9B is biased weaker now due to a lower gate voltage, the voltage $V_b$ on the drain must rise given the same amount of current conducting across this transistor. A voltage rise of $V_b$ in turn causes the output voltage Vout3 to rise back close to the original voltage level through the low-impedance of the input transistors (Q2B, Q3B, Q4B, and Q5B). Accordingly, the more input transistors are on and pulling down the output voltage Vout3, the higher the voltage rise on $V_b$ which leads back to a higher voltage on Vout3. For example, given a n-channel transistor whose gate is biased at 1.5 volts which is near the transistor's threshold of 1.0 volt, the drain voltage $V_b$ is very responsive to the gate voltage if the transistor operates at low current density (large Q9B). As a result, the output logic low voltage having a variation on the order of less than 200 mv between one input transistor turned on and multiple transistors turned on could be designed by selecting a properly sized transistor for Q9B, as compared to a variation of 1.5 volts for the conventional NOR gate of FIG. 1.

The above explains how the output voltage swing is limited to 3.5 volts in the logic high state and to 1.5 volts in the logic low state. By so limiting the voltage swing, faster propagation delay is achieved for both low-to-high and high-to-low transitions on the output. Moreover, in the case in which the output is logic high, the strong pull-up current from transistor Q7B is cut off, leaving just the weak pull-up current from transistor Q1B on. This bias scheme works particularly well for improving speed on the next high-to-low transition because the weak current source creates a very light current loading on the output Vout3. Hence an input transistor needs to turn on only slightly to pull down the output Vout3 to the logic low state. After the output becomes logic low, the strong pull-up current from transistor Q7B turns on again after a finite time delay through inverters I2B and I1B, preparing for a fast pull-up action on the next low-to-high transition.

Figure 4:
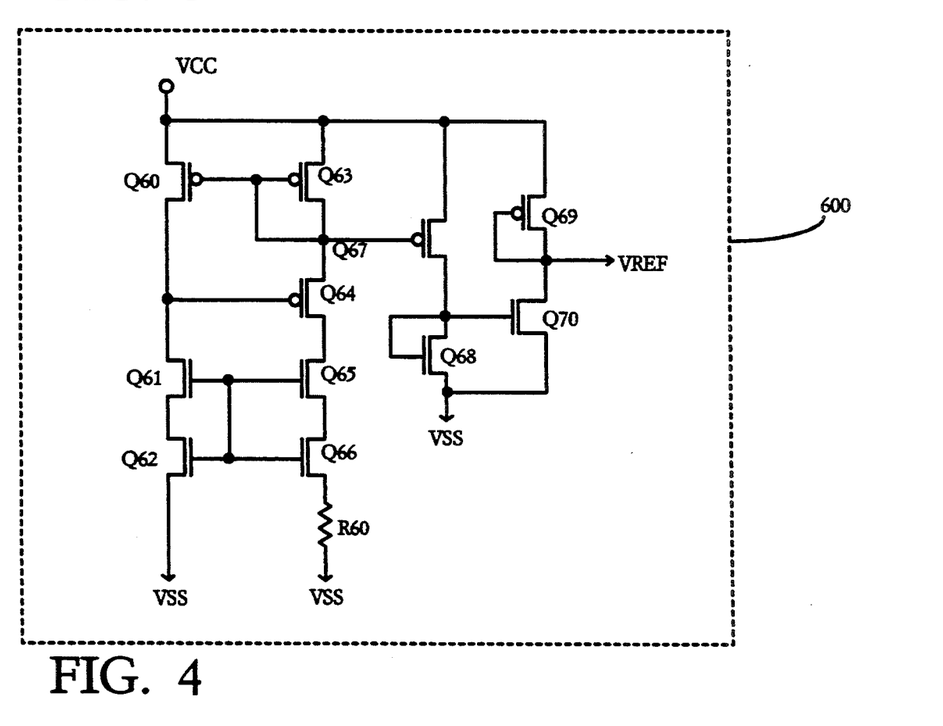
FIG. 4 is a schematic diagram of an illustrative circuit which may be used to generate a temperature varying reference voltage for the high speed NOR gate of the present invention.

Another feature of the present invention is the utilization of a voltage reference to regulate the pull-up current of transistor Q7B. It is desirable to have this current increase with temperature as the silicon junction capacitance also increases with temperature to cause a slow down in the propagation delay. More importantly, the current of the pull-up transistor Q7B would have decreased with temperature due to a decrease in the carrier mobility without any type of voltage regulation. Thus high speed performance at high temperatures requires more pull-up current. The gate signal Vref in FIG. 3 is connected to a voltage reference source such as VIBIAS 600 in FIG. 4 that has a typically generated voltage of 3.0 volts and decreases with temperature. Those skilled in the art will appreciate that other sources of reference potential may be used without departing from the scope of the present invention. As this voltage at the gate of the pull-up transistor Q7B drifts down at high temperatures, more current is conducting as this transistor Q7B is turning on harder.

Figure 5:
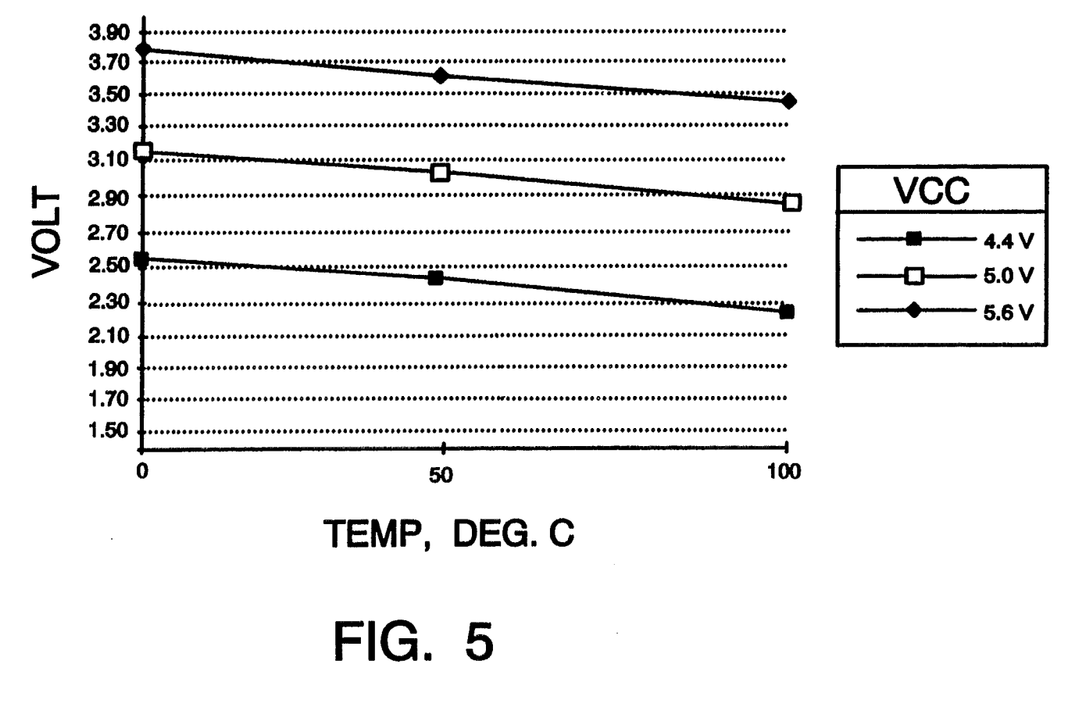
FIGS. 5 illustrates how a reference voltage Vref applied to the gate of transistor Q7B of the NOR gate of the present invention varies with temperature and $V_{cc}$ power supply.
Figure 6:
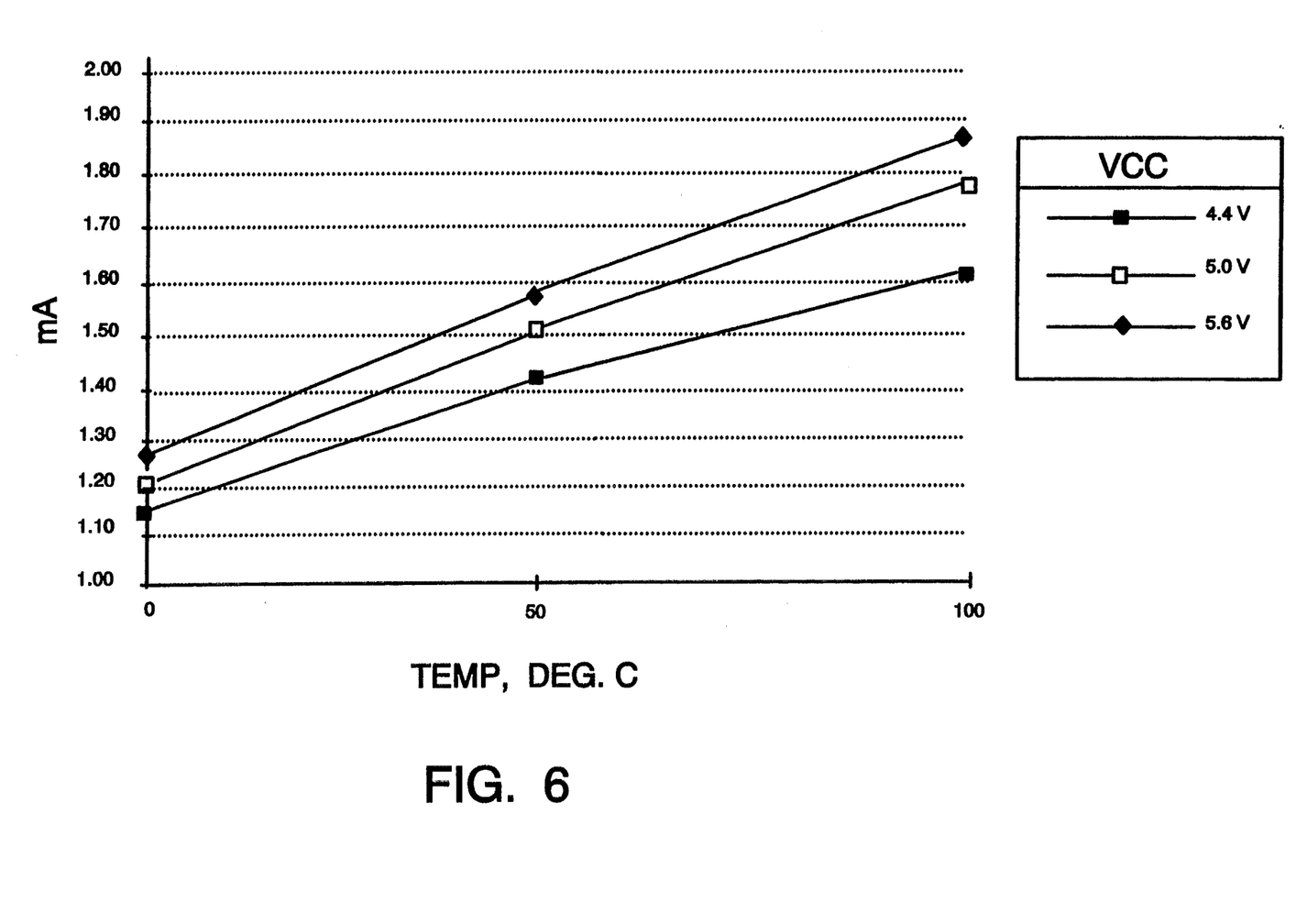
FIG. 6 shows the pull-up current through the transistor Q7B of the NOR gate of the present invention as a function of temperature and $V_{cc}$ power supply.

FIGS. 5 and 6 show the voltage Vref applied to the gate of the transistor Q7B and the pull-up current through the transistor Q7B as a function of temperature and $V_{cc}$ power supply. Note that by selecting a voltage reference source that is voltage compensated, such as the illustrative reference source, the current across transistor Q7B has little sensitivity at different power supply voltages.

Figure 7:
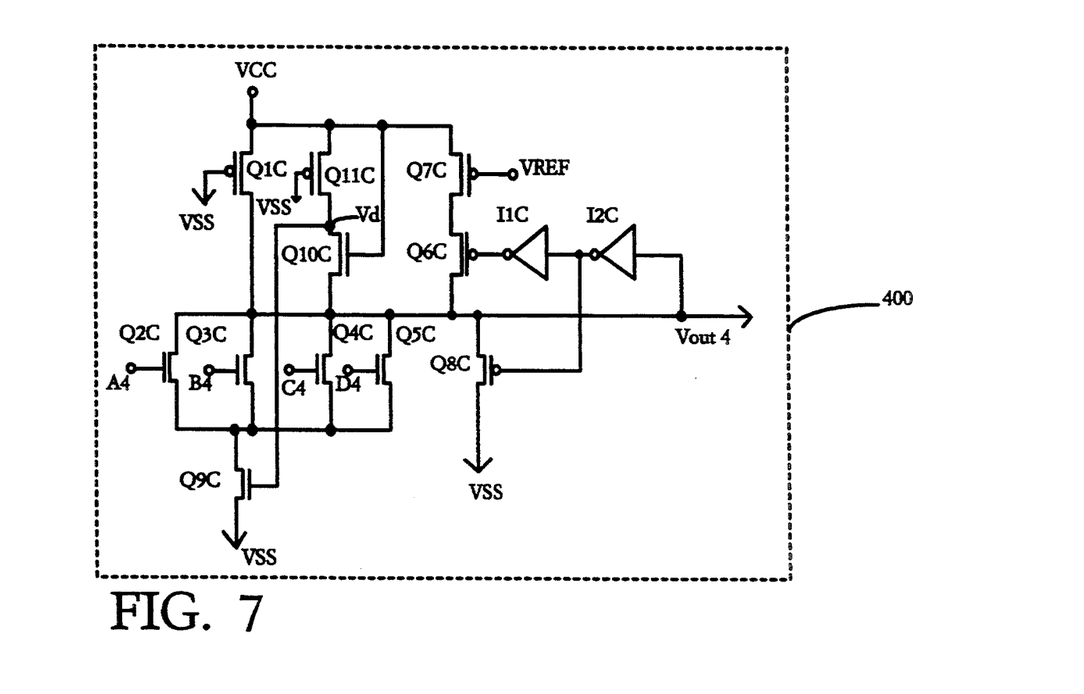
FIG. 7 is an alternative embodiment of the high speed NOR gate of the present invention.

FIG. 7 shows another embodiment 400 of the high speed NOR gate of the present invention. This circuit configuration 400 has additional an p-channel transistor Q11C and an n-channel transistor Q10C. The source of the p-channel transistor Q11C is connected to $V_{cc}$. The drain of the p-channel Q11C is connected to the drain of the n-channel transistor Q10C. The source of the n-channel transistor Q10C is connected to the output of the NOR gate Vout4. The gate of the p-channel transistor Q11C is connected to ground or $V_{ss}$. The gate of the n-channel transistor Q10C is connected to $V_{cc}$.

The n-channel transistor Q10C has a high impedance. The technique used in this NOR gate is the utilization of a transistor Q10C with very high impedance (small size) to somewhat isolate transistor Q9C's large gate capacitance that is otherwise loading on the critical switching node at which the output Vout4 appears. Lowering capacitance on the output node Vout4 results in a faster propagation delay. The gate of transistor Q9C is now connected to the drain $V_d$ of transistor Q10C rather than to Vout4. As a result, the gate voltage of transistor still responds to Vout4 in a similar manner as before through the resistive coupling of transistor Q10C, but at a much slower time rate. This is desirable also as explained below.

When the output Vout4 is at logic high level of say 3.5 volts, the voltage $V_d$ is coupled between 3.5 volts to 5.0 volts (when $V_{cc}$=5.0 volts). Transistor Q9C is turned on strong because the gate is coupled to this high voltage while all the input transistors (Q2C, Q3C, Q4C, and Q5C) are off. As the input transistors are turning on to cause the output to go to a logic low level of 1.5 volts, current is conducting across the input transistors and going across transistor Q9C. For fast discharge, it is desirable to have transistor Q9C remain strongly conductive for as long as possible before the gate voltage follows the output back down to approximately 1.5 volts. This is achieved by delaying the rate of fall for the voltage on the gate of transistor Q9C. The transistors Q11C and Q10C require a small current (few microamps) to operate properly.

Figure 8:
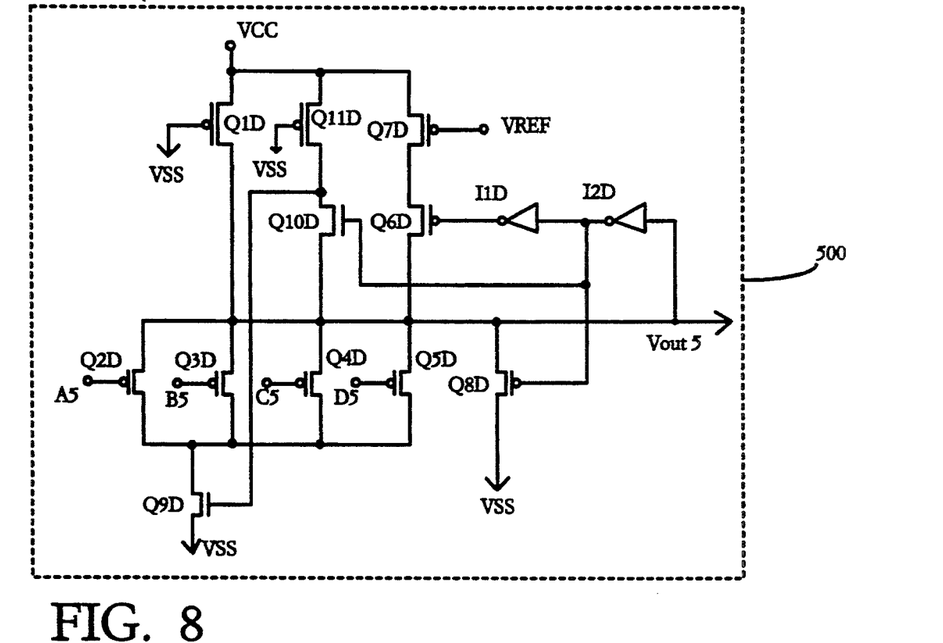
FIG. 8 is a second alternative embodiment of the high speed NOR gate of the present invention.

FIG. 8 shows a third embodiment 500 of the high speed NOR gate of the present invention. This circuit configuration is very similar to that of FIG. 7 with the exception that the gate of transistor Q10D is connected to the output of inverter I2D instead of $V_{cc}$. By doing so, the gate capacitance of transistor Q9D is isolated from the output Vout5 during the logic high state because transistor Q10D is off by means of the gate connection to the logic low output (0 volt) of inverter I2D. As the output voltage falls to a logic low level of say 1.5 volts when the inputs are turning on, the rate of fall for the gate voltage of transistor Q9D is also slower as a result of the extra delay to turn on transistor Q10D through the inverter I2D. Hence, transistor Q9D maintains strongly conductive for longer period of time and the speed on the high-to-low transition on the output is improved.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

What is claimed is:

1. A high speed NOR gate comprising:
   a plurality of pull-down transistors for providing an output signal;
   a feedback transistor coupled between a source of each of the plurality of pull-down transistors and a ground reference voltage, and further coupled to an output node;
   a pull-up transistor coupled to the plurality of pull-down transistors for providing a drive current; and
   a regulator means coupled to the pull-up transistor for regulating the drive current in response to temperature and power supply voltage variation so as to maintain the speed of the output signal during a low-to-high transition of the output signal.

2. A high speed NOR gate as recited in claim 1, wherein each of the plurality of pull-down transistors includes a drain and a source and the plurality of pull-down transistors are coupled together in parallel such that
   the drains of the plurality of pull-down transistors are coupled together and are coupled to an output terminal for providing the output signal; and
   the sources of the plurality of pull-down transistors are coupled together and are coupled to a ground voltage through the feedback transistor.

3. A high speed NOR gate as recited in claim 2, wherein the plurality of pull-down transistors are n-channel MOS devices.

4. A high speed NOR gate as recited in claim 3, wherein the pull-up transistor is a p-channel MOS device.

5. A high speed NOR gate comprising:
   a plurality of pull-down transistors for providing an output signal;
   a pull-up transistor coupled to a power supply, a reference voltage supply circuit, and the plurality of pull-down transistors; and
   a regulator means coupled to the plurality of pull-down transistors for regulating the output signal so that the low level of the output signal is maintained at a predetermined level.

6. A high speed NOR gate as recited in claim 5, wherein each of the plurality of pull-down transistors includes a drain and a source and the plurality of pull-down transistors are coupled together in parallel such that
   the drains of the plurality of pull-down transistors are coupled together and are coupled to an output terminal for providing the output signal; and
   the sources of the plurality of pull-down transistors are coupled together and are coupled to a ground voltage.

7. A high speed NOR gate as recited in claim 6, wherein the plurality of pull-down transistors are n-channel MOS devices.

8. A high speed NOR gate as recited in claim 7, wherein the pull-up transistor is a p-channel MOS device.

9. A high speed NOR gate as recited in claim 5 wherein the regulator means comprises
   a first transistor responsive to the output signal for providing a feedback signal to the plurality of pull-down transistors when the output signal is at a low level immediately after a high-to-low transition; and
   a second transistor responsive to the feedback signal for maintaining the output signal so that the low level of the output signal is maintained at the predetermined level, the second transistor has its drain coupled to the sources of the plurality of pull-down transistors, its source coupled to the ground voltage and its gate coupled to the drain of the first transistor.

10. A high speed NOR gate as recited in claim 9, wherein the first and second transistors are n-channel MOS devices.

11. A high speed NOR gate comprising:
    a plurality of pull-down transistors for providing an output signal;
    a first pull-up transistor coupled to a power supply, a reference voltage supply circuit, and the plurality of pull-down transistors; and
    a regulator means coupled to the plurality of pull-down transistors for regulating the output signal so that the high level of the output signal is maintained at a predetermined level.

12. A high speed NOR gate as recited in claim 11, wherein each of the plurality of pull-down transistors includes a drain and a source and the plurality of pull-down transistors are coupled together in parallel such that
    the drains of the plurality of pull-down transistors are coupled together and are coupled to an output terminal for providing the output signal; and
    the sources of the plurality of pull-down transistors are coupled together.

13. A high speed NOR gate as recited in claim 12, wherein the plurality of pull-down transistors are n-channel MOS devices.

14. A high speed NOR gate as recited in claim 13, wherein the pull-up transistor is a p-channel MOS device.

15. A high speed NOR gate as recited in claim 11 wherein the regulator means comprises a second pull-up transistor, the second pull-up transistor has its source coupled to a power supply voltage and its gate coupled to a ground voltage;

a third transistor responsive to the output signal so that the high level of the output signal is maintained at the predetermined level, the third transistor has its drain coupled to the ground voltage, its source coupled to the drain of the plurality of pull-down transistors and to the drain of the second pull-up transistor; and a first inverter responsive to the output signal when the output signal makes a low-to-high transition for turning off the first pull-up transistor so as to maintain the output signal at the predetermined level, the first inverter has its input coupled to the output signal and its output coupled to the gate of the first pull-up transistor.

16. A high speed NOR gate as recited in claim 15, wherein the second pull-up transistor and the third transistor are p-channel MOS devices.

17. A high speed NOR gate comprising:

a plurality of n-channel MOS pull-down transistors for providing an output signal, each of the plurality of pull-down transistors includes a drain and a source, the plurality of pull-down transistors are coupled together in parallel such that the drains of the plurality of pull-down transistors are coupled together and are coupled to an output terminal for providing the output signal, and the sources of the plurality of pull-down transistors are coupled together and are coupled to a ground voltage;

a first pull-up transistor coupled to the plurality of pull-down transistors for providing a drive current;

a first regulator means coupled to the first pull-up transistor for regulating the drive current in response to temperature and power supply voltage variation so as to maintain the speed of the output signal during a low-to-high transition of the output signal;

a second regulator means coupled to the plurality of pull-down transistors for regulating the output signal so that the low level of the output signal is maintained at a second predetermined level; and a third regulator means coupled to the plurality of pull-down transistors for regulating the output signal so that the high level of the output signal is maintained at a third predetermined level.

18. A high speed NOR gate as recited in claim 17, wherein the second regulator means comprises a first transistor responsive to the output signal for providing feedback signal to the plurality of pull-down transistors when the output signal is at a low level immediately after a high-to-low transition; and a second transistor responsive to the feedback signal for maintaining the output signal so that the low level of the output signal is maintained at the second predetermined level, the second transistor has its drain coupled to the sources of the plurality of pull-down transistors, its source coupled to the ground voltage and its gate coupled to the drain of the first transistor.

19. A high speed NOR gate as recited in claim 18, wherein the third regulator means comprises a second pull-up transistor, the second pull-up transistor has its source coupled to a power supply voltage and its gate coupled to the ground voltage;

a third MOS transistor responsive to the output signal so that the high level of the output signal is maintained at the third predetermined level, the third transistor has its drain coupled to the ground voltage, its source coupled to the drain of the plurality of pull-down transistors and to the drain of the second pull-up transistor;

a first inverter responsive to the output signal when the output signal makes a low-to-high transition for turning off the first pull-up transistor so as to maintain the output signal at the third predetermined level, the first inverter has its input coupled to the output signal and its output coupled to the gate of the first pull-up transistor.

20. A high speed NOR gate as recited in claim 19, wherein the first transistor and the second transistors are n-channel MOS devices and the second pull-up transistor and the third transistor are p-channel MOS devices.

* * * * *